US007004372B2

(12) United States Patent  (10) Patent No.: US 7,004,372 B2
Mayer et al.  (45) Date of Patent:  Feb. 28, 2006

(54) METHOD FOR DETERMINING OPTIMUM BOND PARAMETERS WHEN BONDING WITH A WIRE BONDER

(75) Inventors: Michael Mayer, Neuheim (CH); Jonathan Medding, Birmensdorf (CH)

(73) Assignee: ESEC Trading SA, Cham (CH)

( * ) Notice: Subject to any disclaimer, the term of this patent is extended or adjusted under 35 U.S.C. 154(b) by 106 days.

(21) Appl. No.: 10/686,752

(22) Filed: Oct. 16, 2003

(65) Prior Publication Data
US 2004/0079790 A1   Apr. 29, 2004

(30) Foreign Application Priority Data
Oct. 16, 2002 (CH) .................................. 1739/02
Jun. 18, 2003 (CH) .................................. 1086/03

(51) Int. Cl.
*B23K 20/00* (2006.01)
*B23K 31/02* (2006.01)

(52) U.S. Cl. ...................... 228/102; 228/103; 228/104; 228/180.5

(58) Field of Classification Search ................ 228/102, 228/103, 104, 1.1, 4.5, 180.5
See application file for complete search history.

(56) References Cited

U.S. PATENT DOCUMENTS

| | | | | |
|---|---|---|---|---|
| 3,458,921 | A | * | 8/1969 | Christensen ............. 228/110.1 |
| 5,230,458 | A | * | 7/1993 | Asanasavest ................ 228/102 |
| 5,302,550 | A | | 4/1994 | Hirota et al. |
| 5,443,200 | A | * | 8/1995 | Arikado ....................... 228/102 |
| 5,591,920 | A | | 1/1997 | Price et al. |
| 5,832,412 | A | * | 11/1998 | Guez .......................... 702/75 |
| 5,894,981 | A | | 4/1999 | Kelly |
| 6,460,751 | B1 | | 10/2002 | Thurlemann |
| 6,648,205 | B1 | * | 11/2003 | Mayer et al. ............... 228/102 |

FOREIGN PATENT DOCUMENTS

EP    0 772 036 A2    5/1997
JP    11-97477 A  *  4/1999

OTHER PUBLICATIONS

Rooney, D.T. et al., "Evaluation of Wire Bond Quality By SEM Analysis Ball-Shape and Visual Inspection of Intermetallic Formation", Internaional Journal of Microcircuits and Electronic Packaging Society, U.S. vol. 20, NR. 2, pp. 138-149.

Bocharov, M.l., et al., "An Amplitude Modulator Based on Synthesized Nonlinear Reactive Components", Telecommunications and Radio Engineering, Begell House, Inc., New York, NY, US. vol. 43, NR. 6, pp. 68-71.

Aguila, MA, M., et al., "Ball bond characterization: an intensive analysis on ball size and shear tear results and applicability to existing standards", Electronic Packaging Technology Conference, 1997. Proceedings of the 1997 1st Singapore Oct. 8-10, 1997, New York, NY US, IEEE, US, pp. 46-51.

\* cited by examiner

*Primary Examiner*—Lynne R. Edmondson
(74) *Attorney, Agent, or Firm*—McCormick, Paulding & Huber LLP

(57) ABSTRACT

A predetermined number of bond cycles is carried out in order to find optimum bond parameters for a wire bonder. The bond parameters to be optimized are each varied within a predefined range. With each bond cycle, after attachment of the wire to the connection point, the capillary is moved out of the bond position in a predetermined horizontal direction whereby the current flowing through the drive which moves the capillary is monitored and its maximum determined.

4 Claims, 2 Drawing Sheets

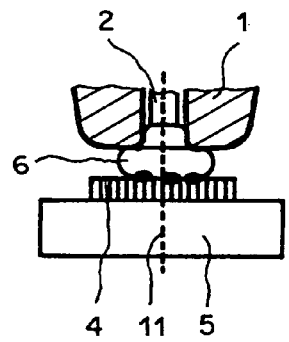 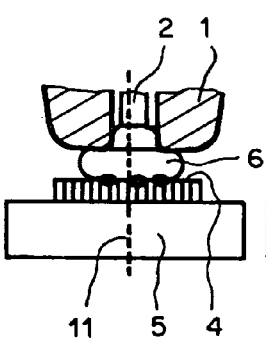 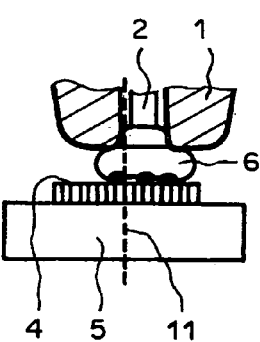 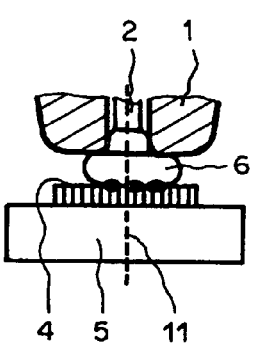
Fig.2A  Fig.2B  Fig.2C  Fig.2D
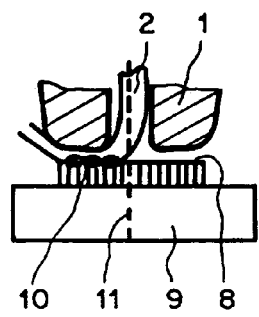 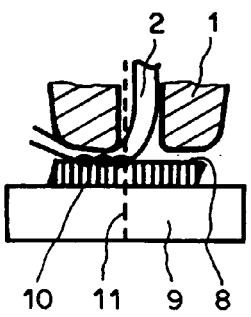 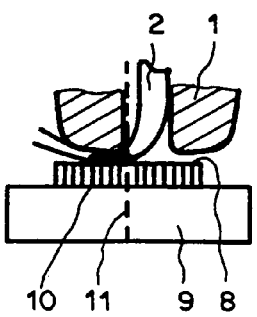 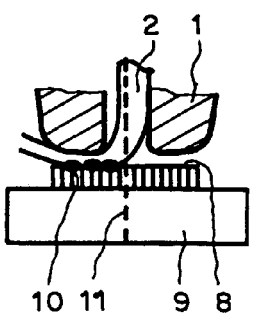
Fig.3A  Fig.3B  Fig.3C  Fig.3D

METHOD FOR DETERMINING OPTIMUM BOND PARAMETERS WHEN BONDING WITH A WIRE BONDER

CROSS REFERENCE TO RELATED APPLICATIONS

Applicant hereby claims foreign priority under 35 U.S.C § 119 from Swiss Patent Application Nos. 2002 1739/02 filed on Oct. 16, 2002 and 2003 1086/03 filed on Jun. 18, 2003, the disclosure of which is herein incorporated by reference.

FIELD OF THE INVENTION

The invention concerns a method for determining optimum bond parameters when bonding with a Wire Bonder.

BACKGROUND OF THE INVENTION

A Wire Bonder is a machine with which wire connections are made to semiconductor chips after they have been mounted on a substrate. The Wire Bonder has a capillary that is clamped to the tip of a horn. The capillary serves to secure the wire to a connection point on the semiconductor chip and to a connection point on the substrate as well as to guide the wire between the two connection points. On making the wire connection between the connection point on the semiconductor chip and the connection point on the substrate, the end of the wire protruding from the capillary is first melted into a ball. Afterwards, the wire ball is secured to the connection point on the semiconductor chip by means of pressure and ultrasonics. In doing so, ultrasonics is applied to the horn from an ultrasonic transducer. This process is known as ball bonding. The wire is then pulled through to the required length, formed into a wire loop and welded to the connection point on the substrate. This last process is known as wedge bonding. After securing the wire to the connection point on the substrate, the wire is torn off and the next bond cycle can begin.

Ball bonding as well as wedge bonding are influenced by various factors. In order to achieve bond connections of a predetermined quality, the adequate values of several physical and/or technical parameters must be determined for a particular process. Examples of such parameters are:

- the bond force, that is the normal force which the capillary exerts on the ball bond or the connection point of the semiconductor chip during the bonding process,
- a parameter, designated herein as ultrasonic variable P, which controls the application of ultrasonics to the ultrasonic transducer. The ultrasonic variable is, for example, the amplitude of the alternating current which flows through the ultrasonic transducer of the horn or the amplitude of the alternating voltage which is applied to the ultrasonic transducer, or the power, or another variable,
- a time duration, designated herein as ultrasonic time T, which indicates the length of time that the ultrasonic variable P is applied to the ultrasonic transducer,
- the impact velocity of the capillary on the connection point,
- a binary parameter that indicates whether the ultrasonic variable is already applied to the ultrasonic transducer before the capillary impacts on the connection point.

Today, in order to characterize the bond quality in the sense of a quality control as well as to determine the optimum bond parameters, two methods are primarily used namely a) a so-called Pull Test, with which the force is measured at which the bond tears away from the semiconductor chip or substrate when the bond is pulled in vertical direction in relation to the surface of the semiconductor chip or substrate, and b) a so-called Shear Test, with which the force is measured at which the bond tears away from the semiconductor chip or substrate when the bond is pushed away parallel to the surface of the semiconductor chip or substrate by means of a tool.

Generally, users prefer the Shear Test for ball bonds, as the results are more reliable than the results of the Pull Test.

These tests are normally carried out with equipment specially developed for this application. However, from the patent U.S. Pat. No. 5,894,981, a Wire Bonder is known which is set up to carry out a Pull Test. With this Wire Bonder however, the Pull Test can only be carried out for Wedge Bonds. From the patent U.S. Pat. No. 5,591,920, a Wire Bonder is known which is set up to carry out a Pull Test with which the maximum current is measured which flows through a motor that raises and lowers the capillary. This test can be carried out for Ball Bonds as well as for Wedge Bonds. When this Pull Test is carried out for a Wedge Bond, then an important disadvantage exists in that, on testing, load is not put on the wedge as with the established Pull Test, but on the piece of wire which is to be torn off in the last stage of the bond cycle, the so-called tail.

SUMMARY OF THE INVENTION

The object of the invention is to develop a method for easily determining optimum bond parameters for ball bonding as well as for wedge bonding.

Optimum bond parameters for a bond force $F_B$ and an ultrasonic variable $P_B$ and, optionally, at least one further bond parameter $G_B$ of a Wire Bonder for ball bonding can be determined in accordance with the invention by means of a method with the following steps:

Carrying out a number of bond cycles of n=1 to k, whereby the bond force $F_B$ and the ultrasonic variable $P_B$ and, if necessary, the at least one further bond parameter $G_B$ are each varied in discrete steps within a predetermined range whereby with each bond cycle a wire connection is made between a connection point of a semiconductor chip and a connection point of a substrate in that a wire end protruding out of a capillary is melted into a ball and then, in a first bond position, the wire ball is attached to the connection point of the semiconductor chip, the wire is then pulled through to the required length, formed into a wire loop and, in the second bond position, attached to the connection point of the substrate, and whereby, for each bond cycle n, after attaching the wire ball to the connection point of the semiconductor chip, the following steps are carried out:

a) Application of a predetermined bond force $F_{B1}$, b) Movement of the capillary out of the bond position in a predetermined horizontal direction whereby the current $I_{B,n}$ flowing through the drive that moves the capillary is monitored, c) Stopping the movement of the capillary as soon as the current $I_{B,n}$ decreases, d) Determining the maximum of the current $I_{B,n,max}$ ($F_{B,n}$, $P_{B,n}$, $G_{B,n}$) from the progression of the current $I_{B,n}$ ($F_{B,n}$, $P_{B,n}$, $G_{B,n}$, t) established during steps b) and c) whereby the variables $F_{B,n}$, $P_{B,n}$, and $G_{B,n}$ are the values for bond force $F_B$, the ultrasonic variable $P_B$ and, if necessary, the at least one further bond parameter $G_B$ set for bond cycle n and the time is designated with parameter t, e) Moving the capillary to the bond position, f) Attaching the wire ball to the connection point of the semiconductor chip, and whereby, from the values $I_{B,n,max}$ ($F_{B,n}$, $P_n$, $G_n$) established with the n bond cycles, those values for the bond force $F_B$, the ultrasonic variable $P_B$ and the if necessary at least one further bond parameter $G_B$ are determined as optimum bond parameters for which the current $I_{B,n,max}$ ($F_{B,n}$, $P_n$, $G_n$) reaches a maximum. For this determining, if need be, the customary methods of statistics such as interpolation, for example, can be used.

The bond force $F_{B1}$ is the same for all shear tests. As a rule, it is set as low as possible so that the result of the shear test is not distorted by friction forces that are active between the underneath of the ball and the connection point. The bond force $F_{B1}$ amounts typically to around 50 mN.

If need be steps e and f can be omitted as they only serve to avoid malfunction of the following bond cycles.

Optimum bond parameters for the bond force $F_W$, the ultrasonic variable $P_W$ and, optionally, the at least one further bond parameter $G_W$ of a Wire Bonder for wedge bonding can be determined by means of an analogous method which assumes other values for the parameters $F_W$, $P_W$ and, if necessary $G_W$ and with which, for each bond cycle n, after attaching the wire to the connection point on the substrate, the following steps are carried out:

a) Applying a predetermine bond force $F_{W1}$, b) Movement of the capillary out of the bond position in a predetermined horizontal direction whereby the current $I_{W,n}$ flowing through the drive that moves the capillary is monitored, c) Stopping the movement of the capillary as soon as the current $I_{W,n}$ decreases, d) Determining the maximum of the current $I_{W,n,max}$ ($F_{W,n}$, $P_{W,n}$, $G_{W,n}$) from the progression of the current $I_{W,n}$ ($F_{W,n}$, $P_{W,n}$, $G_{W,n}$, t), established during steps b) and c) whereby the variables $F_{W,n}$, $P_{W,n}$ and $G_{W,n}$ are the values for bond force $F_W$, the ultrasonic variable $P_W$ and, if necessary, the at least one further bond parameter $G_W$ set for bond cycle n, e) Moving the capillary to the bond position, f) Attaching the wire to the connection point of the substrate, and from the values $I_{W,n,max}$ ($F_{W,n}$, $P_{W,n}$, $G_{W,n}$) established with the n bond cycles, those values for the bond force $F_W$, the ultrasonic variable $P_W$ and the if necessary at least one further bond parameter $G_W$ are determined as optimum bond parameters for which the current $I_{W,n,max}$ ($F_{W,n}$, $P_{W,n}$, $G_{W,n}$) reaches a maximum.

The bond force $F_{W1}$ is the same for all shear tests and, as a rule, is set as low as possible.

With this method, a value is determined with the current $I_{B,n,max}$ for each bond cycle which is proportional to the yield stress in shear and is therefore a measure for the shear strength of the ball bond on the semiconductor chip and, with the current $I_{W,n,max}$, a value which is a measure for the shear strength of the wedge bond on the substrate.

It must be mentioned here that the number of bond parameters that are varied can be different for ball bonding and for wedge bonding.

Furthermore, it must also be mentioned here that the method in accordance with the invention is suitable for implementation on Wire Bonders of different construction.

There are Wire Bonders that have a drive for movement of the horn with the capillary in an x direction and a drive for movement in a y direction orthogonal to the x direction. A Wire Bonder is known from the U.S. Pat. No. 6,460,751 with a drive for movement of the horn and the capillary in a predetermined direction and a second drive for a rotational movement of the horn and the capillary on a rotational axis.

The invention can be used as described for determining optimum bond parameters. The optimum bond parameters $F_1$, $P_1$, $G_1$ for the bond force F, the ultrasonic variable P and further bond parameters G are determined before production operation is started. (Because the number of further bond parameters G is generally greater than 1, the designation $G_1$ stands for a corresponding number of values.) However, in a modified form, the invention additionally enables the in situ monitoring of the bond quality during production operation. To do so, the shear strength of selected bond connections is tested immediately after they have been made in that the capillary is used in order to shear off the bond connection, whereby the maximum of the current flowing through the drive of the capillary is determined. Afterwards, a second bonding process is carried out in order that the ball or wedge detached during the test can be re-attached to the connection point. During bonding, the formed ball or wedge is deformed, in particular pressed flat. When the bond connection is made, separated and made again, then the resulting ball or wedge is too flat and the danger exists that the tested bond connection no longer achieves the required bond quality. For this reason, on making the first bond connection, bond parameters are used which result in a weaker bond connection and which less strongly deform the ball or wedge. The making, shearing off and renewed making of the bond connection therefore take place in accordance with the following process steps:

Making a bond connection on a connection point with predefined values $F_2$, $P_2$, $G_2$ for the bond force F, the ultrasonic variable P and further bond parameters G, whereby at least one of the values $F_2$, $P_2$, $G_2$ is less than the corresponding value $F_1$, $P_1$, $G_1$.

Carrying out the test for quality control according to the following steps:

a) Application of a predetermined bond force $F_3$, b) Movement of the capillary out of the bond position in a predetermined direction whereby the current $I_n(t)$ flowing through the drive which moves the capillary is monitored over the course of time t, c) Stopping the movement of the capillary as soon as the current I(t) decreases, d) Determining the maximum current $I_{max}$ from the progression of the current I(t) established during steps b) and c); and Making the bond connection on the connection point with the values $F_1$, $P_1$, $G_1$.

The invention makes use of the fact that the maximum of the current $I_{max}$, that was established for a bond connection made with the bond parameters $F_2$, $P_2$, $G_2$ is strongly correlated to the maximum of the current $I_{max}$ that was established for a bond connection made with the bond parameters $F_1$, $P_1$ and $G_1$. This is particularly the case when $F_2=F_1$, $G_2=G_1$ and $P_2=\alpha*P_1$, whereby the parameter $\alpha$ is <1. The parameter $\alpha$ lies typically in the range $0.4<\alpha<0.7$. The first bond connection is made, for example, with the parameters $F_2=F_1$, $G_2=G_1$ and $P_2=0.5*P_1$. In order that an assessment of the bond quality is possible, the value below which the current $I_{max}$ must not fall must of course be determined before starting production. The setting up of a new process therefore takes place so that first the optimum bond parameters $F_1$, $P_1$, $G_1$ for the ball connection as well as the wedge connection are determined in accordance with the method described above (whereby the number of bond parameter $G_1$ can be 0 to n), that the bond parameters $F_2$, $P_2$, $G_2$ are then selected and a corresponding minimum value $I_{max,0}$ is determined below which the current $I_{max}$ must not fall for a bond connection made with the bond parameters $F_2$, $P_2$, $G_2$.

In production, the bond quality can now be monitored in that, at specific intervals or on the occurrence of predetermined events, the bond connections are tested according to the method in accordance with the invention. The acquired test values $I_{max}$ are stored in a database so that they can be analysed at any time. Advantageously, production is stopped and an alarm initiated when one or more test values $I_{max}$ are lower than the minimum value $I_{max,0}$.

On the other hand, the process control can also be expanded so that the Wire Bonder independently modifies the bond parameters $F_1$, $P_1$, $G_1$ when one or more test values $I_{max}$ are lower than the minimum value $I_{max,0}$.

In the following, an embodiment of the invention is explained in more detail based on the drawing.

BRIEF DESCRIPTION OF THE DRAWING FIGURES

The accompanying drawings, which are incorporated into and constitute a part of this specification, illustrate one or more embodiments of the present invention and, together with the detailed description, serve to explain the principles and implementations of the invention. The figures are not to scale.

In the drawings:

FIGS. 2A to 2D show up different snapshots during determination of the shear strength of a ball bond, and FIGS. 3A to 3D show different snapshots during determination of the shear strength of a wedge bond.

DETAILED DESCRIPTION OF THE PREFERRED EMBODIMENTS

Figure 1A:
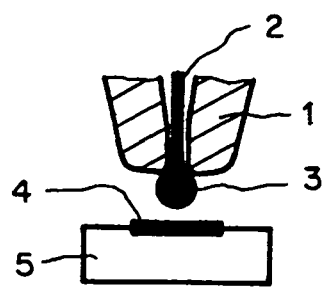
FIGS. 1A to 1E show different phases of a simple bond cycle.

FIGS. 1A to 1E show the different phases of a simple bond cycle:

A) At the tip of a capillary 1, an end of a wire 2 protruding out of the capillary 1 is formed into a wire ball 3 (FIG. 1A).

Figure 1B:
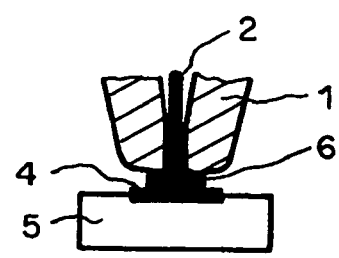

B) The wire ball 3 is bonded to a first connection point 4 of a semiconductor chip 5 (Ball 6) (FIG. 1B).

Figure 1C:
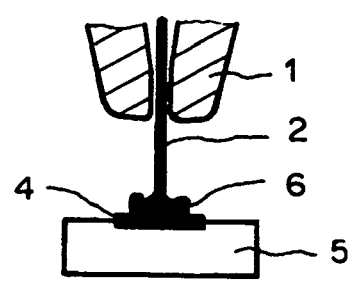

C) The capillary 1 is raised and the wire 2 pulled out to the required length (FIG. 1C).

D) The capillary 1 moves in a predefined trajectory, whereby the wire 2 is formed into a wire loop 7.

Figure 1D:
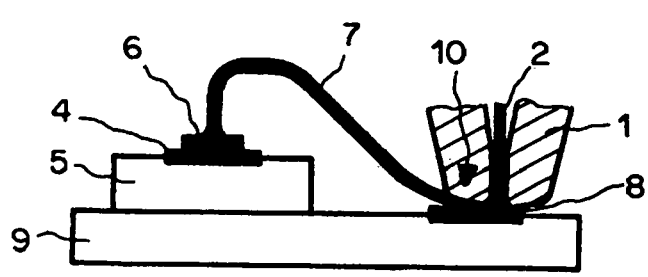
Figure 1E:
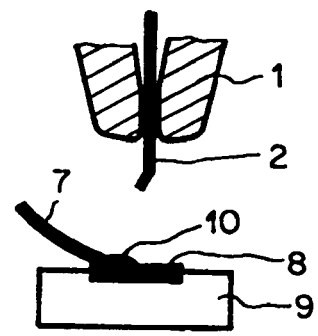

E) The wire 2 is bonded to a connection point 8 of a substrate 9 (Wedge 10) (FIG. 1D)

F) The capillary 1 is raised, whereby the wire 2 tears off at the wedge bond 10 and a short piece of the wire 2 protrudes out of the capillary 1 (FIG. 1E) so that afterwards the next bond cycle can be carried out.

This bond cycle only represents a simple version that suffices for understanding the present invention. However, a multitude of bond cycles are known from trade and patent literature with which the individual steps, in particular steps c) and d) have been further refined. The substrate 9 itself can also be a semiconductor chip, for example, in a multichip module.

To determine the optimum bond parameters for the bond force F, an ultrasonic variable P and, optionally, at least one further bond parameter G of a Wire Bonder for ball bonding as well as for wedge bonding, a number of n=1 to k bond cycles are carried out, whereby the bond force $F_B$ or $F_W$, the ultrasonic variable $P_B$ or $P_W$ and, if necessary, the at least one further bond parameter $G_B$ or $G_W$ are each varied in discrete steps within a predetermined range. With each bond cycle n, after attachment of the wire ball 3 to the connection point 4 of the semiconductor chip 5, ie, after step B and before step C, the following steps are carried out:

B.a) Application of a predetermined bond force $F_{B1}$,

B.b) Movement of the capillary 1 out of the bond position in a predetermined horizontal direction whereby the current $I_{B,n}(t)$ flowing through the drive which moves the capillary 1 is monitored (t represents time), B.c) Stopping the movement of the capillary 1 as soon as the current $I_{B,n}(t)$ decreases, B.d) Determining the maximum of the current $I_{B,n,max}$ ($F_{B,n}$, $P_{B,n}$, $G_{B,n}$) from the time progression of the current $I_{B,n}(t)$ established during steps b) and c) whereby the variables $F_{B,n}$, $P_{B,n}$ and $G_{B,n}$ are the values for bond force $F_B$, the ultrasonic variable $P_B$ and, if necessary, the at least one further bond parameter $G_B$ set for bond cycle n, B.e) Moving the capillary 1 to the bond position, B.f) Attaching the wire ball 3 to the connection point 4 of the semiconductor chip 5.

These steps will now be illustrated in more detail based on FIGS. 2A to 2D. The bond position is represented by a broken line 11 so that the alignment of the capillary 1 can be seen in relation to the bond position. FIG. 2A shows the situation during step B when the wire ball 3 is bonded onto the connection point 4 of the semiconductor chip 5, whereby the ball bond 6 is produced. Bonding of the wire ball 3 takes place with the parameters: Bond force $F_{B,n}$, ultrasonic $P_{B,n}$, and, if necessary, the at least one further bond parameter $G_{B,n}$. The capillary 1 is located in the bond position above the connection point 4.

FIG. 2B shows the situation during step B.b. The not presented horn, at the tip of which the capillary 1 is clamped, is moved in a horizontal direction or rotated on a vertical axis. At the same time, the current I is monitored which flows through the drive which moves or rotates the horn. In doing so, the tip of the capillary 1 presses against the ball attached to the connection point 4 of the semiconductor chip 5. In doing so, the ball and the connection point 4 can be slightly deformed so that the capillary 1 is moved a little away from the bond position. The ball bonded to the connection point 4 however now hinders the capillary 1 and therefore also the horn from carrying out the desired movement. The force exerted by the capillary 1 on the ball in horizontal direction increases continuously until finally the ball detaches itself from the connection point 4. The capillary 1 can now follow the movement of the horn so that the current flowing through the drive quickly reduces, whereupon the movement of the capillary 1 in step B.c is immediately stopped. This situation is shown in FIG. 2C. Later, in step B.e, the capillary 1 is brought back into the bond position and, in step B.f, the ball is again attached to the connection point 4 of the semiconductor chip 5. Two methods are now explained as to how step B.b can be carried out:

According to the first method, the Wire Bonder is instructed to move the tip of the capillary 1 out of its bond position into a new position. This is done by means of a controller that converts a position deviation into a command for the current I flowing through the corresponding drive.

Because, to begin with, the capillary 1 is hindered by the ball in carrying out the movement, the actual position of the capillary 1 does not change so that the difference between the set position and the actual position remains. This causes the controller to continually increase the current I. The current I(t) is continuously recorded and saved as a series of current values $I_1(t), I_2(t+\Delta t), \ldots, I_{m+1}(t+m*\Delta t)$, whereby the variable $\Delta t$ designates a predetermined time duration. If the current value $I_{m+1}$ is less than the previous current value $I_m$, this means that the capillary 1 can move because the ball has now detached itself from the connection point 4 of the semiconductor chip 5 so that the difference between the set position and the actual position becomes smaller. Therefore, in step B.d the value $I_{B,n,max}$ ($F_{B,n}, P_{B,n}, G_{B,n}$)=$I_m$ is stored.

According to the second method, the Wire Bonder is instructed to continually increase the current I flowing through the drive of the capillary 1 and to simultaneously monitor the position of the horn or the capillary 1. The current I is therefore continuously increased in steps $\Delta I$: $I_{m+1}=I_m+\Delta I$. After each current increase, the position of the horn or the capillary 1 is checked. As soon as the position has changed by more than a predetermined value, this means that the ball has now detached itself from the connection point 4 of the semiconductor chip 5. Therefore, in step B.d the value $I_{B,n,max}$ ($F_{B,n}, P_{B,n}, G_{B,n}$)=$I_m$ is stored.

Analogously, after attaching the wire 2 to the connection point 8 of the substrate 9, ie, after step E and before step F, the following steps are carried out:

E.a) Application of a predetermined bond force $F_{W2}$,

E.b) Movement of the capillary 1 out of the bond position in a predetermined horizontal direction whereby the current $I_{W,n}(t)$ flowing through the drive which moves the capillary 1 is monitored, E.c) Stopping the movement of the capillary 1 as soon as the current $I_{W,n}(t)$ decreases, E.d) Determining the maximum of the current $I_{W,n,max}$ ($F_{W,n}, P_{W,n}, G_{W,n}$) from the progression of the current $I_{W,n}(t)$ established during steps b) and c), whereby the variables $F_{W,n}, P_{W,n}$ and $G_{W,n}$ are the values for bond force $F_W$, the ultrasonic variable $P_W$ and, if necessary, the at least one further bond parameter $G_W$ set for bond cycle n, E.e) Moving the capillary 1 to the bond position, E.f) Attaching the wire 2 to the connection point 8 of the substrate 9.

FIGS. 3A to 3D show four snapshots that concern the wedge bonding. FIG. 3A shows the situation during step E when the wire 2 is bonded onto the connection point 8 of the substrate 9. Bonding of the wire 2 takes place with the parameters: Bond force $F_{W,n}$, ultrasonic $P_{W,n}$, and, if necessary, the at least one further bond parameter $G_{W,n}$.

FIG. 3B shows the situation during step E.b. The not presented horn, at the tip of which the capillary 1 is clamped, is moved in a horizontal direction or rotated on a vertical axis. At the same time, the current I is monitored which flows through the drive which moves or rotates the horn. In doing so, the tip of the capillary 1 presses against the wire 2 attached as a wedge 10 to the connection point 8 of the substrate 9 which hinders the capillary 1 and therefore also the horn from carrying out the desired movement. The force exerted by the capillary 1 onto the wedge 10 in horizontal direction increases continually until finally the wedge 10 detaches itself from the connection point 8. The capillary 1 can now follow the movement of the horn so that the current flowing through the drive quickly decreases whereupon the movement of the capillary 1 in step E.c is immediately stopped. This situation is shown in FIG. 3C. Later, in step E.e, the capillary 1 is brought back into the bond position and, in step E.f, the wedge 10 is again attached to the connection point 8 of the substrate 9.

After carrying out the n bond cycles, from the established values $I_{B,n,max}$ ($F_{B,n}, P_n, G_n$), those values for bond force $F_B$, the ultrasonic variable $P_B$ and the, if necessary, one further bond parameter $G_B$ are determined as optimum parameters for ball bonding for which the current $I_{B,n,max}$ ($F_{B,n}, P_n, G_n$) reaches a maximum. Likewise, from the established values $I_{W,n,max}$ ($F_{W,n}, P_{W,n}, G_{W,n}$), those values for bond force $F_W$, the ultrasonic variable $P_W$ and the, if necessary, one further bond parameter $G_W$ are determined as optimum bond parameters for wedge bonding for which the current $I_{W,n,max}$ ($F_{W,n}, P_{W,n}, G_{W,n}$) reaches a maximum.

During step B.b or E.b, the tip of the capillary 1 is only moved a few micrometers, typically 5 to 10 micrometers. This movement suffices to detach the ball or wedge. It is therefore preferably foreseen to interrupt the shear test when the tip of the capillary 1 has moved by more than a predefined distance without the current flowing through the drive having reduced.

Steps B.e and B.f as well as E.e and E.f serve to re-attach the detached ball or wedge to the corresponding connection point so that the following bond cycles can be carried out without malfunction. Steps B.e and E.e can be omitted if required.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. A method for determining optimum bond parameters including a bond force $F_B$ and an ultrasonic variable $P_B$ of a wire bonder for a bond process, whereby for this determination a number of bond cycles are carried out, whereby for each bond cycle a wire connection is made between a connection point of a semiconductor chip and a connection point of a substrate in that a wire end protruding out of a capillary is melted into a ball and then, in a bond position, the wire ball is attached to the connection point of the semiconductor chip, then the wire is pulled through to the required length, formed into a wire loop and attached to the connection point of the substrate, and whereby the bond parameters to be optimized are each varied in discrete steps within a predefined range, wherein with each bond cycle n, after attaching the wire ball to the connection point of the semiconductor chip, the following steps are carried out:

a) applying a predetermined bond force $F_{B1}$, b) moving the capillary out of the bond position in a predetermined direction whereby the current $I_n(t)$ flowing through the drive which moves the capillary is monitored in the course of time t, c) stopping the capillary as soon as the current $I_n(t)$ decreases, d) determining a maximum of the current $I_{n,max}$ from the progression of the current $I_n(t)$ established during steps b) and c), and wherein from the values $I_{n,max}$ established with the n bonding processes those values for the bond parameters are determined as optimum bond parameters for which $I_{n,max}$ reaches a maximum.

2. A method for determining optimum bond parameters including a bond force $F_W$ and an ultrasonic variable $P_W$ of a wire bonder for a bonding process, whereby for this determination a number of bond cycles are carried out, whereby for each bond cycle a wire connection is made between a connection point of a semiconductor chip and a connection point of a substrate, in that a wire end protruding out of a capillary is melted into a ball and then, in a bond position, the wire ball is attached to the connection point of the semiconductor chip, then the wire is pulled through to the required length, formed into a wire loop and attached to the connection point of the substrate, and whereby the bond parameters to be optimized are each varied in discrete steps within a predefined range, wherein with each bond cycle n after attaching the wire to the connection point of the substrate the following steps are carried out:

a) applying a predetermined bond force $F_{W1}$,
b) moving the capillary out of the bond position in a predetermined direction whereby the current $I_n(t)$ flowing through the drive which moves the capillary is monitored in the course of time t,
c) stopping the capillary as soon as the current $I_n(t)$ decreases,
d) determining a maximum of the current $I_{n,max}$ from the progression of the current $I_n(t)$ established during steps b) and c), and wherein from the values $I_{n,max}$ established with the n bonding processes those values for the bond parameters are determined as optimum bond parameters for which $I_{n,max}$ reaches a maximum.

3. A method for in situ monitoring of the quality of bond connections which are produced by means of a wire-feeding capillary of a wire bonder with predetermined values $F_1$, $P_1$, $G_1$ of a bond force F, an ultrasonic variable P and at least one further bond parameter G, wherein a to be tested, selected bond connection is made as follows:

making a bond connection with predefined values $F_2$, $P_2$, $G_2$ for the bond force F, the ultrasonic variable P and the at least one further bond parameter G, whereby at least one of the values $F_2$, $P_2$, $G_2$ is less than the corresponding value $F_1$, $P_1$, $G_1$, carrying out a test according to the following steps:
a) applying a predetermined bond force $F_3$,
b) moving the capillary out of the bond position in a predetermined direction whereby a current I(t) flowing through the drive which moves the capillary is monitored over the course of time t,
c) stepping the capillary as soon as the current I(t) decreases,
d) determining a maximum current $I_{max}$ from the progression of the current I(t) established during steps b) and c); and making the bond connection with the values $F_1$, $P_1$, $G_1$.

4. The method of claim 3, wherein the value $P_2$ is less than the value $P_1$.

* * * * *

UNITED STATES PATENT AND TRADEMARK OFFICE
CERTIFICATE OF CORRECTION

PATENT NO. : 7,004,372 B2  
DATED : February 28, 2006  
INVENTOR(S) : Michael Mayer et al.

Page 1 of 1

It is certified that error appears in the above-identified patent and that said Letters Patent is hereby corrected as shown below:

<u>Column 10,</u>  
Line 18, delete "stepping" and replace with -- stopping --.

Signed and Sealed this

Thirtieth Day of May, 2006

JON W. DUDAS  
*Director of the United States Patent and Trademark Office*